US006757876B2

(12) United States Patent
Habitz

(10) Patent No.: US 6,757,876 B2
(45) Date of Patent: Jun. 29, 2004

(54) METHOD FOR USE OF HIERARCHY IN EXTRACTION

(75) Inventor: Peter A. Habitz, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,444

(22) Filed: Jul. 15, 2002

(65) Prior Publication Data
US 2004/0010762 A1 Jan. 15, 2004

(51) Int. Cl.[7] .............................................. G06F 17/50
(52) U.S. Cl. .................... 716/5; 716/4; 716/6
(58) Field of Search .................. 716/3–6, 8–11

(56) References Cited

U.S. PATENT DOCUMENTS

| | | | | |
|---|---|---|---|---|
| 4,811,237 A | * | 3/1989 | Putatunda et al. | 716/9 |
| 4,924,430 A | * | 5/1990 | Zasio et al. | 716/6 |
| 5,359,535 A | * | 10/1994 | Djaja et al. | 716/6 |
| 5,761,080 A | * | 6/1998 | DeCamp et al. | 716/5 |
| 5,896,300 A | * | 4/1999 | Raghavan et al. | 716/10 |
| 5,901,063 A | * | 5/1999 | Chang et al. | 716/4 |
| 5,956,257 A | * | 9/1999 | Ginetti et al. | 716/3 |
| 5,999,726 A | * | 12/1999 | Ho | 716/11 |
| 6,185,722 B1 | * | 2/2001 | Darden et al. | 716/5 |
| 6,473,887 B1 | * | 10/2002 | Dewey, III et al. | 716/5 |

OTHER PUBLICATIONS

Marple "A layout system based on trapezoidal corner stitching", IEEE transaction on computer–aided design,vol. 9, No. 1, pp. 66–90, Jan. 1, 1990.*
Weyten "List Quad Trees: A geometrical data structure wity imroved performance for large region queries", IEEE transactions, vol. 8, No. 3, pp. 229–233, Mar. 3, 1989.*
Lai et al. "HInted quad trees for VLSI geometry DRC based on efficieht searching for neighbors", IEEE transaction, vol. 15, pp. 317–324, Mar. 3, 1996.*
Mehta et al. "Corner stitching for simple rectilinear shapes [VLSI layouts]", IEEE transaction, vol. 16, pp. 186–198, Feb. 2, 1997.*

* cited by examiner

Primary Examiner—Vuthe Siek
Assistant Examiner—Naum Levin
(74) Attorney, Agent, or Firm—McGinn & Gibb, PLLC; Richard M. Kotulak, Esq.

(57) ABSTRACT

A method and system for extracting circuit characteristics from a circuit design comprises extracting first cell characteristics from a portion of said circuit design using a first set of environmental conditions. The invention then extracts second cell characteristics from the portion of the circuit design using a second set of environmental conditions. The invention determines a difference between the first cell characteristics and the second cell characteristics and labels a placeability of the portion of the circuit design based on the difference.

21 Claims, 3 Drawing Sheets

METHOD FOR USE OF HIERARCHY IN EXTRACTION

BACKGROUND OF THE INVENTION

1. Field of the Invention

The present invention generally relates to microelectronic chip design, and more particularly to a method of modeling a logic cell for circuit level models.

2. Description of the Related Art

Generally, integrated circuits are electrical circuits comprised of transistors, resistors, capacitors, and other electrical components on a single semiconductor chip in which the components are interconnected to perform a given function. A circuit designer designs an integrated circuit by creating a circuit schematic indicating the electrical components and their corresponding interconnections. Moreover, designs are simulated by computer-aided design programs to verify the functionality and to ensure that performance goals are satisfied.

The layout of an integrated circuit contains parasitic resistances and capacitances from the interconnections and devices. The values of these so-called parasitics are functions of the process parameters, shape and dimensions of a particular geometry, and relationship of a particular geometry to other geometries. These parasitics affect the performance and possibly the functionality of an integrated circuit. Consequently, during the design phase of an integrated circuit, these parasitics are extracted from a layout and taken into consideration during circuit simulation.

Integrated circuits which are fabricated using deep submicron processes are becoming mainstream, but are complex. One of the challenges faced by today's deep sub-micron integrated circuit designers is the issue of parasitic effects of passive interconnect ions. Deep sub-micron integrated circuit designers are recognizing that these effects cannot be ignored, otherwise the design can fail. These effects also play an important role in timing, power, reliability, as well as noise performance. In order to take parasitic effects of passive interconnects into consideration in post layout analysis for timing, power, etc., it is necessary to create electrical models for the physical connections present between the various devices in a deep sub-micron integrated circuit design, a process known as parasitic extraction. As such, multiple parasitic extractions performed repeatedly at different points in time to create multiple electrical models for different views of the design are often required.

General designs are created using hierarchical methodologies. Here, small circuits are designed and evaluated, and then connected to larger functions until the full chip is assembled. Each element of the hierarchy is called a cell (logic cell) and the basic circuit functions, which include devices and interconnects, are called leaf-cells.

The problem associated with most conventional extraction programs is that they work in a flat manner. That is, the conventional extraction programs ignore the design hierarchy. Some packages have the option to use design hierarchy without a check and simply ignore placement dependent changes. These conventional systems make the user responsible for the inaccuracies.

More sophisticated solutions use an active radius around each wire and check whether the environment within this radius is constant. Variations outside of this radius are considered small and ignored. However, because these solutions are often rigid in their application, this leaves open the possibility that some variations important in the hierarchical design are ignored, thus resulting in an inaccurate manner in which to model a logic cell. Therefore, there remains a need for a new and improved process and system of modeling a logic cell using parasitic extraction techniques in a worst-case environment for the logic cell.

BRIEF SUMMARY OF THE INVENTION

In view of the foregoing and other problems, disadvantages, and drawbacks of the conventional modeling techniques for logic cells using hierarchical extraction processes, the present invention has been devised, and it is an object of the present invention to provide a system and method for modeling a logic cell.

In order to attain the object suggested above, there is provided, according to one aspect of the invention, a method of extracting circuit characteristics from a circuit design that extracts first cell characteristics from a portion of the circuit design using a first set of environmental conditions. Next, the invention extracts second cell characteristics from the portion of the circuit design using a different, second set of environmental conditions. The invention determines the difference between the first cell characteristics and the second cell characteristics. The invention compares this difference to a predetermined standard. The invention labels the portion of the circuit design as freely placeable within any area of said circuit design if the difference is less than the predetermined standard. Next, the invention replaces the portion of the circuit with a placeholder cell if the portion of the circuit design is freely placeable. The invention forms the placeholder cell in a process that includes shorting all conductors in the portion of the circuit design to a ground node. The invention then merges all the conductors in a given level of the portion of the circuit design. Next, the invention removes all the conductors that are covered by overlying conductors from the portion of the circuit design. The invention merges the conductors outside the portion of the circuit design that are within a predetermined distance to the circuit design to conductors within the portion of the circuit design. The circuit characteristics comprise at least one of capacitance, impedance, power, and resistance.

The first environmental conditions represent the best environment and the second environmental conditions represent the worst environment. The best environment has the minimum amount of wiring adjacent the portion of the circuit and the worst environment has the maximum amount of wiring adjacent the portion of the circuit. The invention calculates average cell characteristics from the portion of the circuit design for the placeholder cell.

To decouple the full (schematic and parasitic) model of one cell from its environment both the impact of the environment on the cell and the impact of the cell on the environment must be considered. Generally, according to the present invention, the amount of variation a cell can tolerate must be determined. Then, a calculation of how much variation different placements can cause is performed. A decision of whether the cell is freely placeable is made based on the level of variation for that cell.

Designed blocks of circuitry or cells are preferably reused in different environments, with different wires running over, next to, or even through the previously characterized design. If all these different environments do not change the characteristic of the description of this cell significantly, the cell can be placed anywhere on the die without timing model changes, and it is considered freely placeable. When the cell is found to be freely placeable the cell undergoes parasitic extraction in an "average" environment (centered between the worst and best environment standards) and the timing model for the cell is created. The model can be stored for use with the final assembly of the part with all leaf cells and interconnect cells, or it can be characterized and simplified, when a final detailed assembly is not required. The next step the invention takes is characterization of the parent cell without the just characterized cell being present. For this step the invention replaces the cell with a simplified model leaf cell, which just contains the important elements for characterization of the interconnect cell. This leaf cell model is sometimes called a placeholder. This highly simplified placeholder design contains just the features which can impact the extraction of the interconnect, or more generally the environment of the leaf cell, so that internal extraction calculations internal to the leaf cell itself can be dropped out of further extraction processes. This placeholder is an automatically created design, which will never be released, and is just built to enable efficient extraction.

The invention makes this placeholder a virtual design, without ever actually creating the shapes and nodes the placeholder contains. The most efficient creation of the leaf cell depends on the programming environment. The placeholder is created by first connecting all nodes within the leaf cell together to one single unique node of this cell. This brings all shapes onto the same potential, still adjustable together for sensitivity studies from the outside. This method is accurate when the potential changes within the cell can be neglected.

In addition, the invention merges all the shapes which are overlapping within the leaf cell. This step reduces the number of edges within the leaf cell, thus simplifying the extraction from outside. Also, shapes which are close but not overlapping can be merged without much loss of accuracy. For this step, a closeness threshold is used. This step relies upon the fact that the fringe capacitance each shape makes the shape look larger from the outside. All hidden shapes are also removed, as they cannot be seen from outside and hence do not impact the extraction of the parent cell. Then, this highly simplified placeholder design is used to represent the cell to minimize the impact of the environment extraction which is tied to its own node. The extraction of the environment cell or parent cell is preformed with the placeholder present. This makes this extraction step much more accurate than just dropping the leaf cell out of extraction as done in many products.

The degree of simplification affects the extraction runtime improvements. Naturally, the runtime improvement depends on the degree the placeholder could be simplified in comparison to the full model. Moreover, ports are created at the contact point to the simplified placeholder cell model. Then, the environment is extracted with the placeholder using changed capacitance formulas for any capacitance going to the placeholder node. The new formulas included in the tolerance are the impact of possible active nodes in the virtual cell. For all practical purposes, this node will be at ground. But to check the sensitivity, it can be of benefit to separate the two nodes. To measure the capacitance connected with ground, for ground bounce tests, it is important to have the nodes separated. Finally, the previously extracted cell model is added to the extracted net list. For every instance of the cell, a placeholder is added. So it is an advantage to have the placeholder significantly simpler than the real cell.

The present invention provides a powerful method which allows the ability to reuse characterized cells multiple times and in multiple instances, wherein different instances of the same cells are in different environments in the chip assembly. The extraction process calculates the resistances and capacitances (RC) of parasitic elements including all connecting conductors and wires. Because capacitances of the interconnect depend of the environment, conventional systems have not been able to reuse a once extracted cell over many instances. Thus, the present invention describes a method to rigorously evaluate the cases in which a hierarchy can be used.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Figure 1:
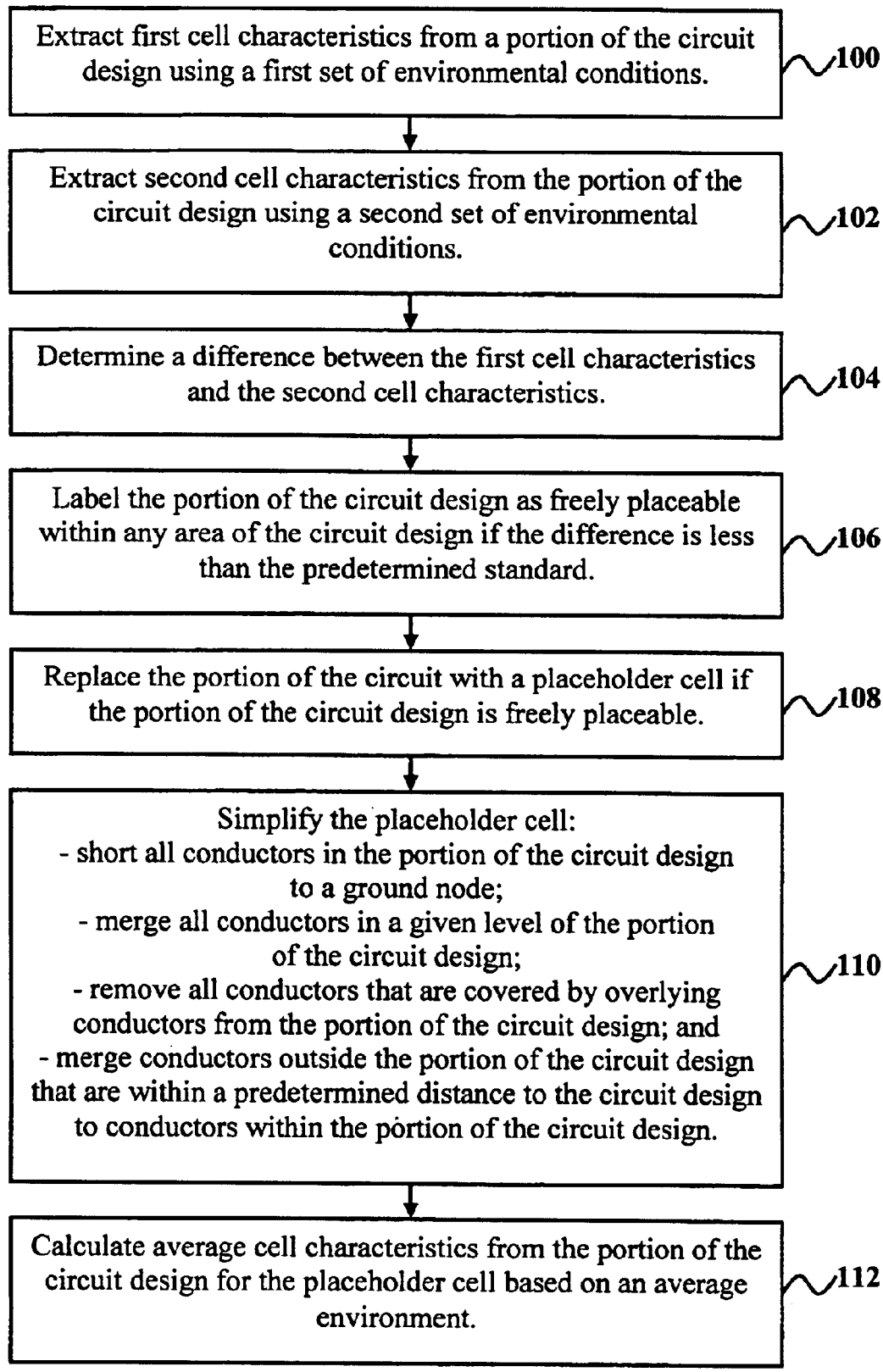
FIG. 1 is a flow diagram illustrating a preferred method of the invention.

Detailed Description of Preferred Embodiments of the Invention

As previously mentioned, there is a need for a new and improved process and system of modeling a logic cell using parasitic extraction techniques in a worst-case environment for the logic cell. General designs are created using hierarchical methodologies. Here, small circuits are designed and evaluated, and then connected to larger functions until the full chip is assembled. Each element of the hierarchy is called a cell (logic cell) and the basic circuit functions, which include devices and interconnects, are called leafcells.

To decouple the full (schematic and parasitic) model of one cell from its environment both the impact of the environment on the cell and the impact of the cell on the environment must be considered. Generally, according to the present invention, the amount of variation a cell can tolerate must be determined. Then, a calculation of how much variation different placements can cause is performed. A decision of whether the cell is freely placeable is made based on the level of variation for that cell.

Designed blocks of circuitry or cells are preferably reused in different environments, with different wires running over, next to, or even through the previously characterized design. If all these different environments do not change the characteristic of the description of this cell significantly, the cell can be placed anywhere on the die without timing model changes, and it is considered freely placeable. When the cell is found to be freely placeable the cell undergoes parasitic extraction in an "average" environment (centered between the worst and best environment standards) and the timing model for the cell is created. The model can be stored for use with the final assembly of the part with all leaf cells and interconnect cells, or it can be characterized and simplified, when a final detailed assembly is not required. The next step the invention takes is characterization of the parent cell without the just characterized cell being present. For this step the invention replaces the cell with a simplified model leaf cell, which just contains the important elements for characterization of the interconnect cell. This leaf cell model is sometimes called a placeholder. This highly simplified placeholder design contains just the features which can impact the extraction of the interconnect, or more generally the environment of the leaf cell, so that internal extraction calculations internal to the leaf cell itself can be dropped out of further extraction processes. This placeholder is an automatically created design, which will never be released, and is just built to enable efficient extraction.

The invention makes this placeholder a virtual design, without ever actually creating the shapes and nodes the placeholder contains. The most efficient creation of the leaf cell depends on the programming environment. The placeholder is created by first connecting all nodes within the leaf cell together to one single unique node of this cell. This brings all shapes onto the same potential, still adjustable together for sensitivity studies from the outside. This method is accurate when the potential changes within the cell can be neglected.

In addition, the invention merges all the shapes which are overlapping within the leaf cell. This step reduces the number of edges within the leaf cell, thus simplifying the extraction from outside. Also, shapes which are close but not overlapping can be merged without much loss of accuracy. For this step, a closeness threshold is used. This step relies upon the fact that the fringe capacitance each shape makes the shape look larger from the outside. All hidden shapes are also removed, as they cannot be seen from outside and hence do not impact the extraction of the parent cell. Then, this highly simplified placeholder design is used to represent the cell to minimize the impact of the environment extraction which is tied to its own node. The extraction of the environment cell or parent cell is preformed with the placeholder present. This makes this extraction step much more accurate than just dropping the leaf cell out of extraction as done in many products.

The degree of simplification affects the extraction runtime improvements. Naturally, the runtime improvement depends on the degree the placeholder could be simplified in comparison to the full model. Moreover, ports are created at the contact point to the simplified placeholder cell model. Then, the environment is extracted with the placeholder using changed capacitance formulas for any capacitance going to the placeholder node. The new formulas included in the tolerance are the impact of possible active nodes in the virtual cell. For all practical purposes, this node will be at ground. But to check the sensitivity, it can be of benefit to separate the two nodes. To measure the capacitance connected with ground, for ground bounce tests, it is important to have the nodes separated. Finally, the previously extracted cell model is added to the extracted net list. For every instance of the cell, a placeholder is added. So it is an advantage to have the placeholder significantly simpler than the real cell.

Referring now to the drawings, and more particularly the figures, there are shown preferred embodiments of the method and system according to the present invention. Specifically, in the flow diagram in FIG. 1, the method of modeling a logic cell comprises extracting first cell characteristics from a portion of the circuit design 100. In item 102, the invention extracts second cell characteristics from the portion of the circuit design using a second set of environmental conditions. The invention determines the difference between the first cell characteristics and the second cell characteristics in 104. Next, in 106, the invention labels the portion of the circuit design as freely placeable within any area of the circuit design if this difference is less than the predetermined standard. The invention replaces the portion of the circuit with a placeholder cell if the portion of the circuit design is freely placeable in 108.

The invention, in item 110, simplifies the placeholder cell by shorting all conductors in the portion of the circuit design to a ground node. Next, the invention merges all the conductors in a given level of the portion of the circuit design. The invention remove all conductors that are covered by overlying conductors from the portion of the circuit design. The invention then merges the conductors outside the portion of the circuit design that are within a predetermined distance to the circuit design to conductors within the portion of the circuit design. In item 112, the invention calculates the average cell characteristics from the portion of the circuit design for the placeholder cell using an "average" environment that is between the "worst" and "best" environments (preferably centered between these environments).

Furthermore, according to the present invention, the environment of the maximum noise impact from the cell is included. Here, a possible coupling interaction occurs from any of the replaced cells to the parent conductors. When a node internal to the cell switches at the same time as a node in the parent cell switches, the coupling capacitance between the conductors causes an effective increase or reduction of the load capacitance in the parent cell. This effect can be included into the tolerance of the capacitance of the parent cell extraction. To do this for the best case condition, the capacitance between the parent cell and the placeholder cell is reduced by the coupling and in worst case condition, the capacitance is increased. These capacitances are referred to as "Miller" capacitances as they describe the Miller effect, which describes the impact of simultaneous switching nets on capacitance loads. This is performed with a loss of performance by selecting different parameters for the capacitances to the placeholder. This requires the creation of new levels for the placeholder shapes and the appropriate new capacitance fitting parameters.

According to the present invention, two sets of merged shapes are created: friendly net conductor (power and other DC lines) and possible aggressive net conductors. Shadowing still applies to both sets of conductors together. This restricts the use of the Miller capacitance tables and biases to the aggressive conductors. Thereafter, this result can be compared with the regular nominal analysis to determine the maximum impact of coupling. If the difference (delta) is small compared to the port labels of the parent cell, the hierarchical extraction is working correctly. If the differences (delta) are too large, then the use of hierarchy may not be possible.

Figure 2:
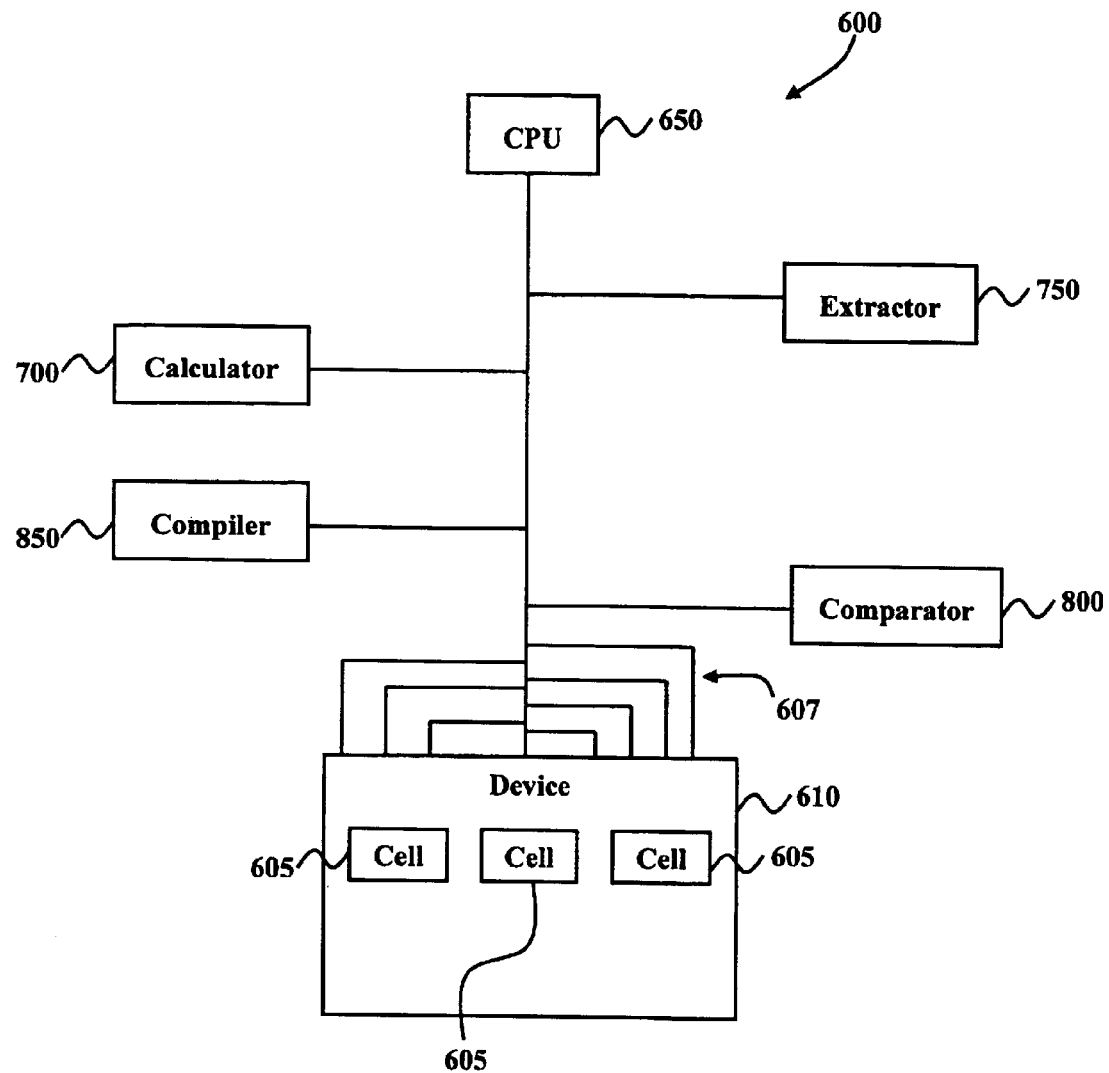
FIG. 2 is a system diagram according to the present invention.

FIG. 2 shows a computer system for modeling a logic cell, wherein the computer system 600 comprises a central processing unit 650, a calculator 700 performing the calculating step 100, an extractor 750 performing the extracting step 200, a comparator 800 performing the comparing step 300, and a compiler 850 performing the merging step 400 and making step 500.

Figure 3:
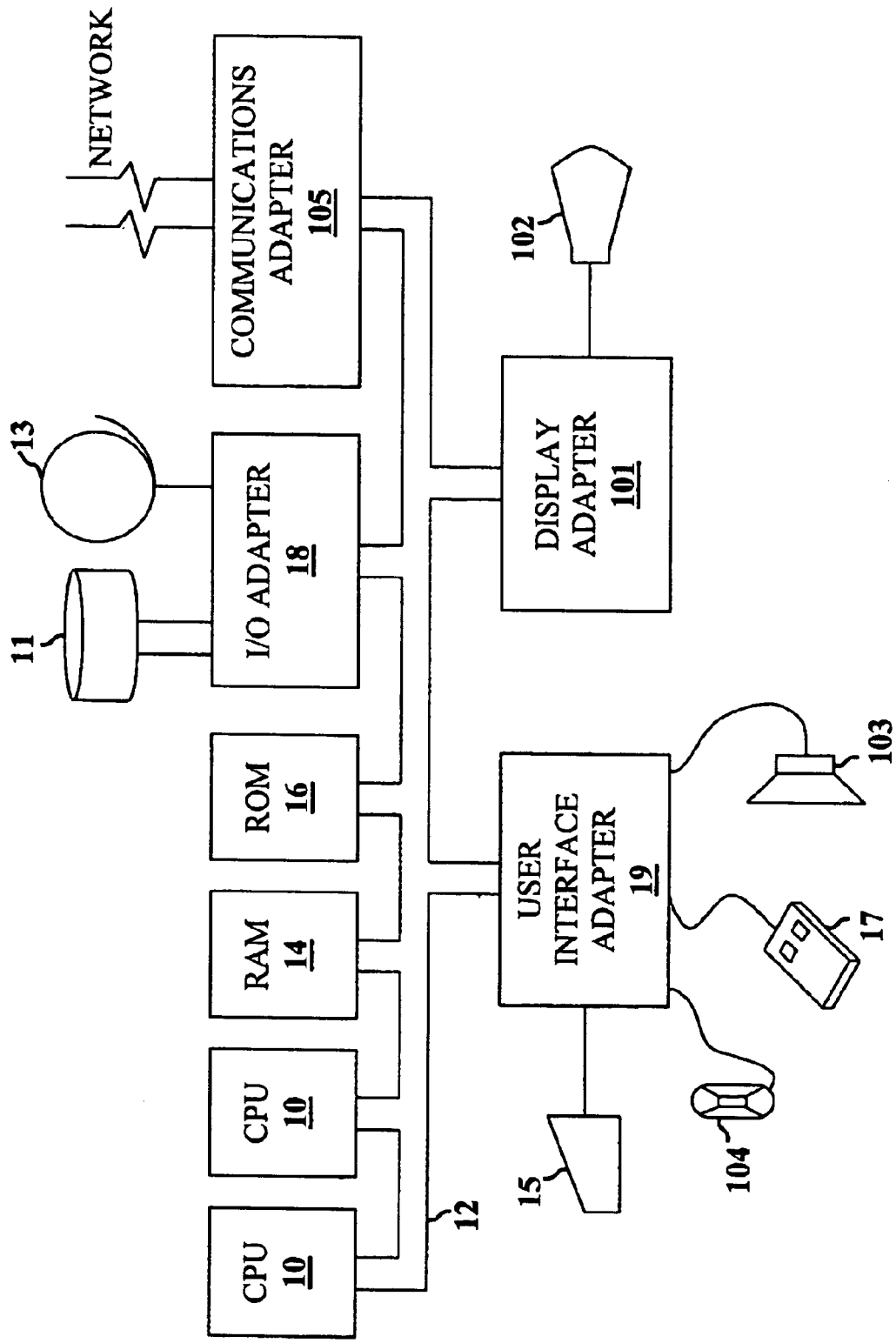
FIG. 3 is a system diagram according to the present invention.

A representative hardware environment for practicing the present invention is depicted in FIG. 3, which illustrates a typical hardware configuration of an information handling/computer system in accordance with the present invention, having at least one processor or central processing unit (CPU) 10. The CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units is used to load the instructions, which operate the invention which is loaded onto the computer system.

One benefit is that the present invention provides the impedance information on each port within the hierarchy. The parent cell port impedance contains everything within the parent cell, the impedances from the lower cell ports, and the extracted values from the connection to the parent cell.

Another benefit is that the invention calculates the impact of the changing environments. According to the present invention, the extraction methodology occurs for best case, average case, and worst case process conditions. Another benefit of the present invention is that the invention calculates the maximum change that can be caused by different placements. Thus, according to the present invention, the worst case environment includes the worst case process conditions, which includes all possible and properly spaced wire placements with actual wires. Nothing is added in the best case processes. The change in capacitance due to the additional wiring is then compared with the best case environment, which allows the ability to decide whether the cell performance is independent of the placement.

Then, the placeholder cell is created. The placeholder cell is simplified to deliver only the necessary information to the parent cell. The present invention simplifies the placeholder cell by shorting all conductors of the cell to a new common cell node which is tied to ground. Conductors of the parent cell are still connected to the conductors of the cell, so their capacitance is not changed. Moreover, all conductors on the same physical level are merged into one shape, and any conductor covered by a higher or outside conductor is removed, thereby making the cell more simplified or "hollow". Because all conductors are on the same node, and fringe capacitances effectively enlarge any conductor to the outside, any close conductors can be merged into one shape, thereby removing holes out of the outside shell of the placeholder to further simplify the placeholder cell.

These steps significantly simplify the capacitance calculation from the parent to the placeholder cell, and deliver a significantly improved performance boost to the extraction step.

The present invention is more flexible than conventional programs and systems, and evaluates the error according to the circuit needs. Moreover, the present invention delivers many more cases in which hierarchy can be used, and in this way, provides a much larger performance advantage.

While the invention has been described in terms of preferred embodiments, those skilled in the art will recognize that the invention can be practiced with modification within the spirit and scope of the appended claims.

What is claimed is:

1. A method of extracting circuit characteristics from a circuit design, said method comprising:
    extracting first cell characteristics from a portion of said circuit design using a first set of environmental conditions;
    extracting second cell characteristics from said portion of said circuit design using a second set of environmental conditions;
    determining a difference between said first cell characteristics and said second cell characteristics;
    labeling a placeability of said portion of said circuit design based on said difference;
    replacing said portion of said circuit with a leaf cell if said portion of said circuit design is freely placeable; and
    merging all overlapping shapes within said leaf cell into a single shape.

2. The method in claim 1, wherein said circuit characteristics comprise at least one of capacitance, impedance, power, and resistance.

3. The method in claim 1, wherein said first environmental conditions comprise a best environment and said second environmental conditions comprise a worst environment.

4. The method in claim 3, wherein said best environment includes a minimum amount of wiring adjacent said portion of said circuit and said worst environment includes a maximum amount of wiring adjacent said portion of said circuit.

5. The method in claim 1, wherein said labeling of said placeability comprises:
    comparing said difference to a predetermined standard; and
    labeling said portion of said circuit design as freely placeable within any area of said circuit design if said difference is less than said predetermined standard.

6. A method of extracting circuit characteristics from a circuit design, said method comprising:
    extracting first cell characteristics from a portion of said circuit design using a first set of environmental conditions;
    extracting second cell characteristics from said portion of said circuit design using a second set of environmental conditions;
    determining a difference between said first cell characteristics and said second cell characteristics;
    labeling a placeability of said portion of said circuit design based on said difference;
    replacing said portion of said circuit with a placeholder cell if said portion of said circuit design is freely placeable; and
    merging all overlapping shapes within said placeholder cell into a single shape.

7. The method in claim 6, wherein said circuit characteristics comprise at least one of capacitance, impedance, power, and resistance.

8. The method in claim 6, wherein said first environmental conditions comprise a best environment and said second environmental conditions comprise a worst environment.

9. The method in claim 8, wherein said best environment includes a minimum amount of wiring adjacent said portion of said circuit and said worst environment includes a maximum amount of wiring adjacent said portion of said circuit.

10. The method in claim 6, wherein said labeling of said placeability comprises:
    comparing said difference to a predetermined standard; and
    labeling said portion of said circuit design as freely placeable within any area of said circuit design if said difference is less than said predetermined standard.

11. The method in claim 6, further comprising calculating average cell characteristics from said portion of said circuit design for said placeholder cell based on an average environment.

12. A program storage device readable by machine, tangibly embodying a program of instructions executable by the machine to perform a method of extracting circuit characteristics from a circuit design, said method comprising:

extracting first cell characteristics from a portion of said circuit design using a first set of environmental conditions;

extracting second cell characteristics from said portion of said circuit design using a second set of environmental conditions;

determining a difference between said first cell characteristics and said second cell characteristics;

labeling a placeability of said portion of said circuit design based on said difference;

replacing said portion of said circuit with a leaf cell if said portion of said circuit design is freely placeable; and merging all overlapping shapes within said leaf cell into a single shape.

13. The program storage device in claim 12, wherein said circuit characteristics comprise at least one of capacitance, impedance, power, and resistance.

14. The program storage device in claim 12, wherein said first environmental conditions comprise a best environment and said second environmental conditions comprise a worst environment.

15. The program storage device in claim 14, wherein said best environment includes a minimum amount of wiring adjacent said portion of said circuit and said worst environment includes a maximum amount of wiring adjacent said portion of said circuit.

16. The program storage device in claim 12, wherein said labeling of said placeability comprises:

comparing said difference to a predetermined standard; and labeling said portion of said circuit design as freely placeable within any area of said circuit design if said difference is less than said predetermined standard.

17. A method of extracting circuit characteristics from a circuit design, said method comprising:

extracting first cell characteristics from a portion of said circuit design using a first set of environmental conditions;

extracting second cell characteristics from said portion of said circuit design using a second set of environmental conditions;

determining a difference between said first cell characteristics and said second cell characteristics;

comparing said difference to a predetermined standard;

labeling said portion of said circuit design as freely placeable within any area of said circuit design if said difference is less than said predetermined standard;

replacing said portion of said circuit with a placeholder cell if said portion of said circuit design is freely placeable;

simplifying said placeholder cell by merging all overlapping shapes within said placeholder cell into a single shape, wherein said merging comprises:

shorting all conductors in said portion of said circuit design to a ground node;

merging all conductors in a given level of said portion of said circuit design;

removing all conductors that are covered by overlying conductors from said portion of said circuit design; and merging conductors outside said portion of said circuit design that are within a predetermined distance to said circuit design with conductors within said portion of said circuit design.

18. The method in claim 17, wherein said circuit characteristics comprise at least one of capacitance, impedance, power, and resistance.

19. The method in claim 17, wherein said first environmental conditions comprise a best environment and said second environmental conditions comprise a worst environment.

20. The method in claim 19, wherein said best environment includes a minimum amount of wiring adjacent said portion of said circuit and said worst environment includes a maximum amount of wiring adjacent said portion of said circuit.

21. The method in claim 17, further comprising calculating average cell characteristics from said portion of said circuit design for said placeholder cell.

* * * * *